United States Patent [19]

Fletcher et al.

[11] 3,764,933

[45] Oct. 9, 1973

[54] CONTROLLED OSCILLATOR SYSTEM WITH A TIME DEPENDENT OUTPUT FREQUENCY

[76] Inventors: James C. Fletcher, Administrator of the National Aeronautics & Space Administration with respect to an invention of; Robin A. Winkelstein, La Crescenta, Calif.

[22] Filed: Sept. 27, 1972

[21] Appl. No.: 292,681

[52] U.S. Cl. ........................ 331/1 A, 331/4, 331/14, 331/17, 331/1.8, 331/178

[51] Int. Cl. ........................ H03b 3/04, H03b 23/00

[58] Field of Search .................. 331/1 A, 4, 14, 17, 331/18, 25, 178

[56] References Cited

UNITED STATES PATENTS

| | | | |
|---|---|---|---|
| 3,185,938 | 5/1965 | Pelosi | 331/1 A |
| 3,504,294 | 3/1970 | Martin, Jr. | 331/4 |
| 3,568,083 | 3/1971 | Harzer | 331/4 |

*Primary Examiner*—Roy Lake
*Assistant Examiner*—Siegfried H. Grimm
*Attorney*—Monte F. Mott et al.

[57] ABSTRACT

A controlled oscillator system is disclosed for providing an output with a frequency which changes with respect to time and with a phase which is within established phase error limits. The system includes a frequency synthesizer with a symmetrical search oscillator, capable of tuning the output with a range of ±100 Hz about any fixed frequency to which the synthesizer is set. For a tuning range of 200 Hz (±100 Hz) an expanded search oscillator output of a frequency range of 4 MHz (from 1 MHz to 5 MHz) is provided. A counter counts continuously the expanded output cycles and at each of fixed sampling intervals, e.g., every 0.1 second, the count or number accumulated in the counter is read out. The sample number is compared with a theoretical number which should be present in the counter at the particular sampling instant for proper synthesizer's output frequency and phase. Any difference between the numbers is used to generate an error signal which controls the input to the search oscillator to adjust the frequency and/or phase of the synthesizer's output.

8 Claims, 4 Drawing Figures

$T = 0.1$ SECOND $K_1 = 10 \div 2^{15} = 0.305 \cdot 10^{-3}$ VOLT / COMPUTER INTEGER $K_2 = 0.2155$ / SECOND $K_3 = 4 \cdot 10^6 \div 20 = 2 \cdot 10^5$ CYCLES / VOLT-SECOND $K_4 = 1$ COMPUTER INTEGER / CYCLE $K = \frac{T^2}{2} K_1 K_2 K_3 K_4 = 0.06577$

CONTROLLED OSCILLATOR SYSTEM WITH A TIME DEPENDENT OUTPUT FREQUENCY

ORIGIN OF INVENTION

The invention described herein was made in the performance of work under a NASA contract and is sjbject to the provisions of Section 305 of the National Aeronautics and Space Act of 1958, Public Law 85–568 (72 Stat. 435; 42 USC 2457).

BACKGROUND OF THE INVENTION

1. Field of the Invention

The present invention relates generally to oscillator circuitry and, more particularly, to a controlled oscillator for providing an output of a changing frequency with respect to time and which is well defined in term of phase.

2. Description of the Prior Art

Applications exist in which it is necessary to produce an output of a changing frequency as a precalculated function of time and which is very well defined in term of phase within permissible limits of phase error. Such a need exists in a telecommunication receiver or transmitter in order to compensate for known doppler frequency effect, produced by the relative motion between a spacecraft and a tracking station. In some space exploration applications these signals must exhibit a high degree of phase coherence. Although herebefore oscillator control systems have been developed to produce an output or signal with a changing frequency as a preselected function of time the signal phase is not controlled or precisely defined, a requirement which exists in some applications, e.g., deep space exploration.

OBJECTS AND SUMMARY OF THE INVENTION

It is a primary object of the present invention to provide a new controlled oscillator system to produce a signal with accurately controlled phase characteristics.

Another object of the invention is to provide a new controlled oscillator system operable in a phase tracking mode to provide a signal of a changing frequency as a precalculated function of time and in which the phase is defined and accurately controlled.

These and other objects of the invention are achieved by providing a system incorporating a frequency synthesizer having symmetrical search oscillator tuning about a fixed frequency. The search oscillator forms part of and is controlled by a phase control feedback loop as opposed to a frequency control feedback loop, to insure that the phase error of the synthesizer's output is within well defined design limits. Defining the fixed frequency as $f_o$ as the search oscillator frequency changes from one end of its range to the other, the output frequency of the synthesizer changes from $f_o-f_s$ to $f_o+f_s$. Thus, the frequency range of the search oscillator is analogous to a change of $\pm f_s$ in the synthesizer's output frequency. An expanded search oscillator output is provided with a precise relationship to the internal search oscillator frequency. The range of the expanded output is much greater than $2f_s$. Thus, a change of one cycle per second in the frequency of the synthesizer is represented by a change of many cycles per second in the frequency of the expanded output.

Each cycle of the expanded search oscillator output is counted by a counter which forms part of the phase control feedback loop. At precise instances, e.g., every 0.1 second the count in the counter is sampled to provide a number which is compared with a theoretically derived number for the particular instance in time. Any difference between the numbers is used to generate an error number which is in turn used to vary the control signal to the search oscillator to correct both frequency and phase of the synthesizer's output.

The novel features of the invention are set forth with particularity in the appended claims. The invention will best be understood from the following description when read in conjunction with the accompanying drawings.

DETAILED DESCRIPTION OF THE PREFERRED EMBODIMENTS

The present invention may best be explained in connection with a specific example although it should be appreciated that the invention is not limited thereto. Let it be assumed that it is desired to produce a signal with a changing frequency as a selected function of time with a well defined phase. Let the change of frequency be from 30,000,000 Hz to 30,000,200 Hz over a period of 1 hour. It is further assumed that the exact frequency and phase every 0.1 second during the hour are also known.

Figure 1:
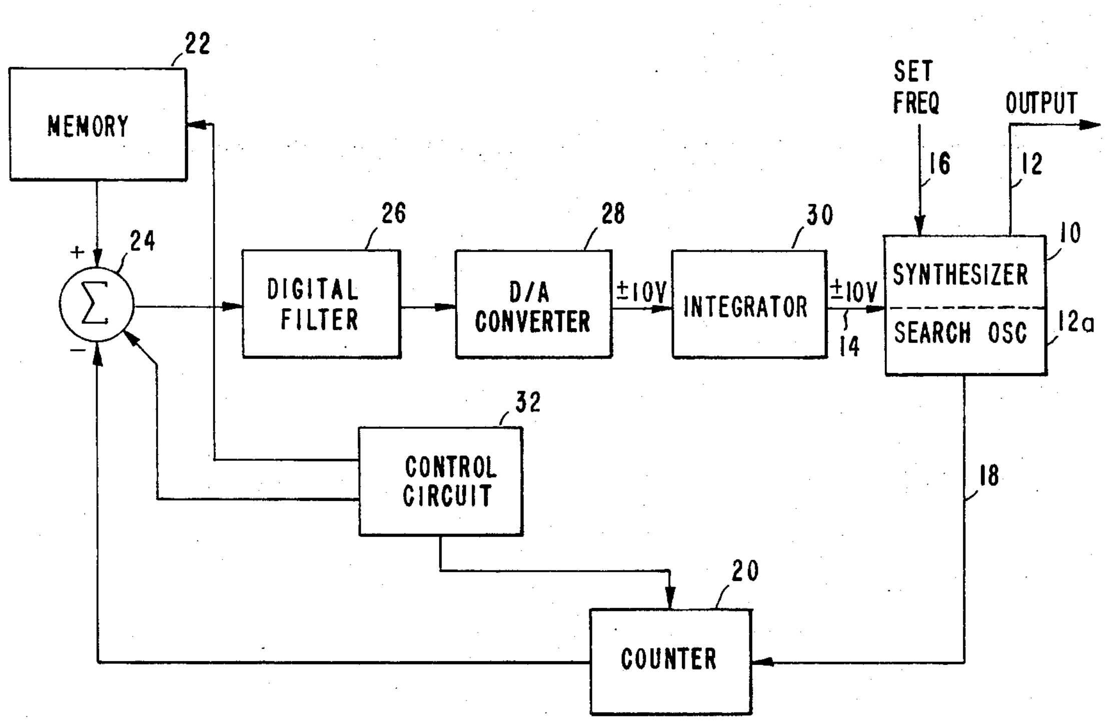
FIG. 1 is a block diagram useful in explaining the principles of the present invention.

In accordance with the present invention the output is provided from a frequency synthesizer designated in FIG. 1 by numeral 10, on output line 12.

The frequency synthesizer includes a symmetrical search oscillator 12*a* of the voltage controlled type, i.e., a VCO which provides a frequency as a function of the voltage applied at input terminal 14. Let it be assumed that the input voltage range is ±10 volts.

As is appreciated the search oscillator frequency changes as a function of the input voltage and the change in the synthesizer's frequency is directly a function of the search oscillator's frequency. For explanatory purposes let it be assumed that with an input voltage of $-10v$ the search oscillator is at its lower end of the frequency range, resulting in a change of −100 Hz in the synthesizer's frequency, while with an input voltage of $+10v$ the search oscillator is at the upper end of its frequency range, resulting in a change of +100 Hz in the synthesizer's frequency. Thus, as the search oscillator is swept through its frequency range, the synthesizer's frequency changes from its set value by −100 Hz to +100 Hz. The search oscillator frequency range can be thought of as affecting the synthesizer's frequency by ±100 Hz, and therefore the search oscillator frequency range can be defined as ∓100 Hz.

In the present example at the start of the hour a control signal on line 16 sets the frequency of the synthesizer to 30,000,100 and the input voltage to the search oscillator is set to $-10v$. Thus, the search oscillator is at its lower frequency limit thereby controlling the actual output frequency of the synthesizer to be 30,000,100 − 100 = 30,000,000 Hz. As time proceeds the input voltage at terminal 14 is increased from −10*v* so that at precisely the end of the hour the input voltage is +10*v*. Consequently, the search oscillator is at its upper frequency limit which causes the frequency of the synthesizer to be 30,000,100 + 100 = 30,000,200 Hz. During the hour every 0.1 second the input voltage to the search oscillator is controlled by means of a phase control feedback loop to insure that the frequency provided by the search oscillator is one that results in the desired frequency and phase of the output signal at the particular instant in time.

The frequency synthesizer 10 provides an expanded search oscillator output at terminal 18. In one example, the expanded output varies from 1 MHz to 5 MHz with precise mathematical relationship to the internal search oscillator frequency. The expanded output has a frequency of 1 MHz when the search oscillator input is −10*v* and its frequency is at its lower limit, while providing a frequency of 5 MHz when the search oscillator is at its upper limit in response to an input of +10*v*. The following table summarizes the frequency relationship between the input voltage, the change of the synthesizer's frequency from its set value and the expanded search oscillator output.

TABLE

| INPUT | CHANGE IN SYNTHESIZER/ FREQUENCY | EXPANDED OUTPUT |
|---|---|---|
| −10v | −100 Hz | 1 MHz |
| −5v | −50 Hz | 2 MHz |
| 0 | 0 Hz | 3 MHz |
| +5v | +50 Hz | 4 Mhz |
| +10v | +100 Hz | 5 MHz |

As seen from FIG. 1 the expanded output at terminal 18 is supplied to a counter 20 which counts continuously the expanded output. Thus, each cycle of the expanded output increments the count or number in the counter by one. The incorporation of the expanded search oscillator output in the present invention is most significant. In the present example this output varies from 1 MHz to 5 MHz with precise mathematical relationship to the internal search oscillator frequency. Since the counter 20 can only count to an accuracy of ± one cycle, by incorporating the expanded output an accuracy of one part in 4,000,000 is achieved in determining the search oscillator frequency in its range of ±100 Hz. In the particular example a change in the synthesizer's frequency by 1 Hz is represented by a change in the expanded output frequency by 20,000 Hz since a change of 4,000,000 Hz in the expanded output frequency indicates a change of 200 Hz in the synthesizer's frequency.

As previously stated the exact desired output frequency and phase every 0.1 seconds during the hour are also known. They may be represented in term of numbers which should be present in the counter every 0.1 seconds if the desired frequency and phase were actually produced. For explanatory purposes these numbers may be thought of being prestored in a storage device, such as a computer memory 22 from which the numbers are successively read out every 0.1 seconds.

In accordance with the invention every 0.1 seconds to an accuracy of 1 microsecond, the counter is sampled and its count or number at that instant is supplied to a summing circuit 24 to which a number from the memory 22 is also supplied. The circuit 24 which acts as a subtractor provides a numerical error representing the difference between the actual number from the counter and the number received from the computer memory 22. Since the number from the memory represents the number which should have been in the counter at the particular point in time, if the output frequency and phase were the desired ones, any difference between this number and the actual number from the counter represents an error in the desired output.

The numerical error signal from circuit 24, which is an error number is supplied to a digital filter 26 which provides in less than 10 milliseconds after the sampling instant an error-representing number to a digital-to-analog converter 28, whose output range is ±10*v*. It is supplied to an integrator 30 whose output is the input voltage to the search oscillator. The input voltage is controlled to vary the search oscillator frequency so as to minimize the difference between the subsequent comparison between the next number read out from memory 22 and the number accumulated in the counter, thereby insuring that the output frequency and phase of the synthesizer output are within the desired limits.

In the present invention the counting of the expanded output by the counter is continuous and is not interrupted when the count or number therein is sampled every 0.1 seconds. The counter automatically recycles through zero when a full count is reached therein. In practice the counter is of sufficient bit length so that the full value is reached after many seconds. It should be stressed that in the present invention each sampling instance, i.e., each 0.1 second, the sample number which is supplied to the circuit 24 is the absolute count in the counter rather than the difference between the present count and the one present in the counter at the previous sampling instant.

It should be apparent to those familiar with the art that various techniques may be used to sample each 0.1 second the counter count, supply the sample number and the theoretical number from memory 22 to the circuit 24 to produce the difference between the two numbers. For explanatory purposes control circuit 32 which is assumed to include a timer represents the circuitry needed for such operations.

It should be appreciated by those familiar with the art that the absolute count in the counter represents a count of the cycles of the expanded output from a given instance in time, i.e., the start of the hour. Thus, this count provides a phase count in terms of cycles of frequency where each cycle is 360° rather than degrees of frequency. However, since the expanded output has a range of 4,000,000 cycles which is equal to a range of 200 cycles of the synthesizer output frequency one cycle of the expanded output actually represents a small fraction of a degree of phase. Indeed when the synthesizer's output frequency is multiplied by 64 each cycle of the expanded output represents 1.15° of phase, since, $$(200/4,000,000 \times 360° \times 64 = 1.15°$$

As previously pointed out each number in the memory, hereafter referred to as the theoretical number, represents the exact number which should be in the counter at a particular sampling instant if the frequency and phase of the synthesizer output are exactly as precalculated, for the particular sampling instant. Thus, when comparing the theoretical number with the number actually accumulated in the counter any difference between the numbers indicates an error. It is used to adjust the frequency of the search oscillator and thereby control the output of the synthesizer to be of the proper frequency and phase.

It should be appreciated that since the output frequency of the synthesizer is continuously changing with time it is important to adjust the search oscillator frequency so that it corrects for any present error, without over-correction, which will result in an oscillating mode of operation.

Herebefore it was assumed that the theoretical numbers which should be present in the counter every 0.1 seconds for proper frequency and phase output are prestored in the memory. Clearly such number prestoring is not necessary since each theoretical number can be calculated just prior to its use in the comparison with the actual number accumulated in the counter. Such calculations may be performed by a computer based on the frequency and phase values obtained from the equation which defined the desired frequency change versus time. In one system actually reduced to practice in which the teachings of the invention are incorporated these calculations are actually performed by a computer, which in addition samples the counter every 0.1 seconds, determines the difference between the calculated number and the sample number from the counter and controls the operation of the digital filter as will be described hereafter.

The particular system which was reduced to practice was developed due to the requirement for simultaneous coherent phase reception of signals at two Deep Space Network (DSN) stations in an interferometer mode of operation. Phase stability needed for interferometric signal processing is less than 10° drift per minute and less than 5° rms phase noise at the S-band operating frequency of 2,388 MHz. Such accuracy is consistent with the development of the Hydrogen Maser Frequency Standard.

Figure 2:
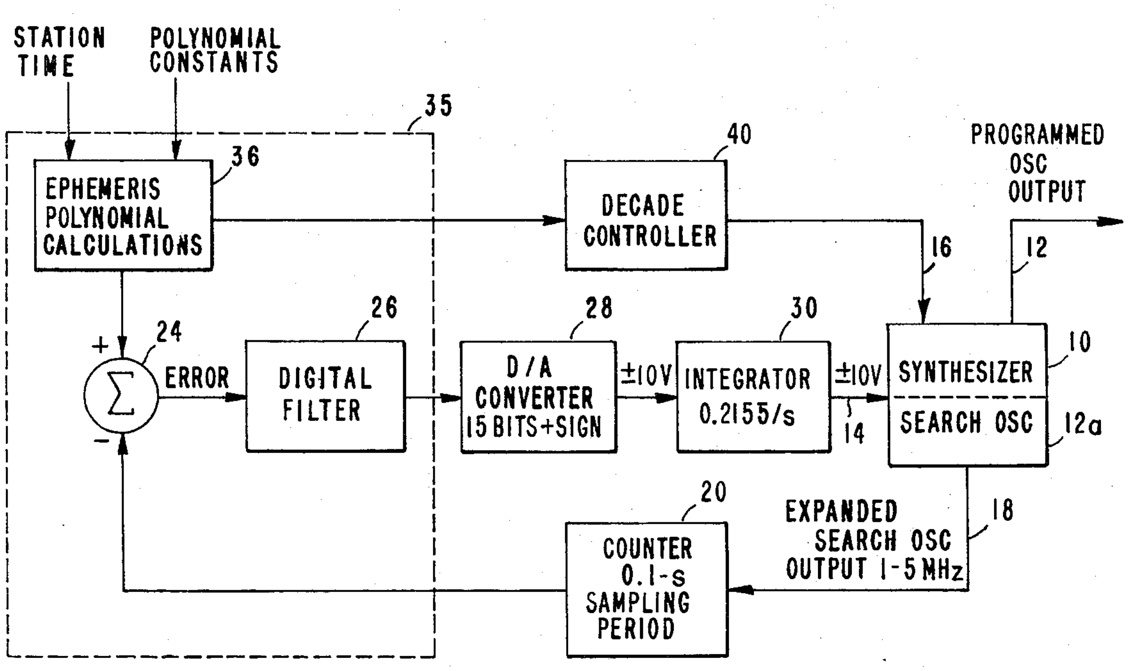
FIG. 2 is a block diagram of a specific system in which the teaching of the present invention are incorporated.

FIG. 2 to which reference is made is a block diagram of the particular system. Therein elements like those previously described are designated by like numerals. In the particular system a Fluke 644A frequency synthesizer is used as synthesizer 10. A Lockheed MAC-16 minicomputer, designated by number 35, is also incorporated. The primary function of the computer is to compute the desired phase from the ephemeris polynomial equation versus time and use the derived values to operate the search oscillator loop in a stable low-noise manner. The ephemeris polynomial is a 15th degree Chebyshev polynomial whose constants have been calculated from orbit determination and curve fitting programs. In the particular application quadruple precision is used within the minicomputer to evaluate the polynomial every 32 seconds. The tenth-second phase numbers herebefore referred to as the theoretical numbers, are obtained from a second-order interpolation of the frequency values obtained from the polynomial calculation.

At the beginning of operation, station time and precalculated ephemeris polynomial constants are input to the computer to perform ephemeris polynomial calculations, represented by block 36. After the initial solution of the polynomial equations, the computer sets the range center frequency of the synthesizer via line 16. As previously indicated the synthesizer has a symmetrical search oscillator whose frequency range reflects a change of ±100 Hz or 200 Hz in the synthesizer output.

Since the search oscillator is symmetrical the midpoint of the search oscillator range can be set at any desired frequency. As previously described, if the frequency is to start at 30,000,000 the synthesizer is set by the computer to 30,000,100 and the search oscillator is fed with −10$v$ so that it is at its lower frequency limit thereby reflecting a −100 Hz in the synthesizer output. Thus, the output is 30,000,000 Hz.

Frequencies between 30,000,000 Hz and 30,000,200 Hz are obtained by controlling the search oscillator input voltage, which is controlled by the feedback controlled loop, as previously described.

As previously pointed out in the synthesizer, an expanded search oscillator output is provided. It varies between 1 MHz and 5 MHz for a synthesizer output change of 200 Hz. Each cycle of this expanded output is counted by the counter 20 which is sampled by the computer every 0.1 seconds. Based on the tenth-second phase or theoretical numbers which the computer obtains from the second-order interpolation of the frequency values, obtained from the polynomial calculations, the computer forms by means of circuit 24 error numbers. Basically, these error numbers represent the differences between the desired phase numbers calculated from the polynomial and the phase numbers obtained from the counter. These error numbers are digitally filtered by filter 26 which also forms part of the computer and are output as control numbers to the DAC 28.

In the particular implementation DAC 28 has 15 bits plus sign, thus accommodating a complete computer word of 16 bits which represents the error number from the digital filter 26. An output of up to ±10$v$ is obtainable from the converter with a resolution of 305 $\mu$V. This voltage is fed to integrator 30 which in the particular implementation has a gain of 0·2155/second. The integrator has a linear output range of ±10$v$ which controls the frequency of the search oscillator and thereby the output frequency and phase of the synthesizer as well as the expanded output frequency which is used in the closed control loop.

Figure 3:
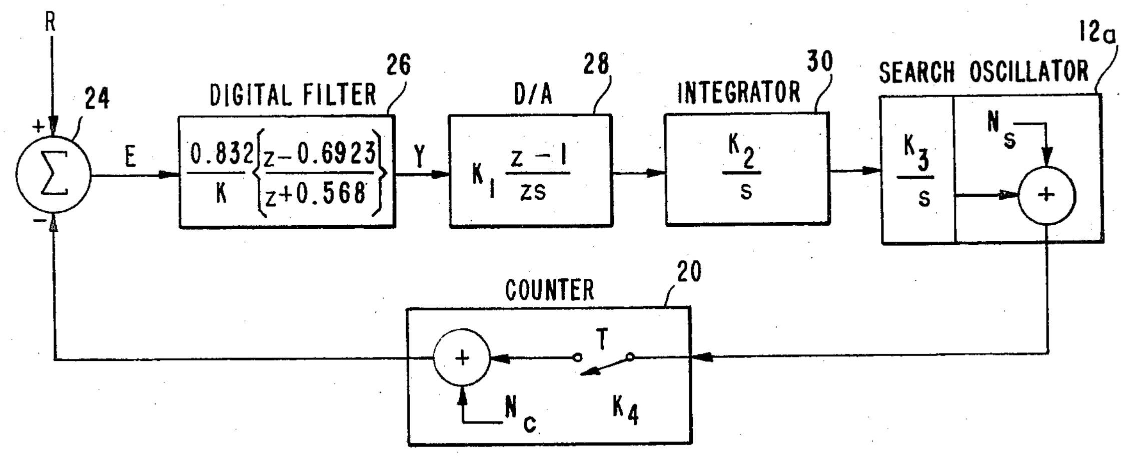
FIG. 3 is a block diagram and mathematical representation of the search oscillator feedback control loop.

FIG. 3 is a mathematical representation of the search oscillator control loop which is employed in the system actually reduced to practice. In the figure $s$ is the Laplace complex frequency, $z$ is equal to $e^{sT}$, $e$ is the Naperian logarithmic base, and T is the sampling time of 0.1 second. Shown also are the noise sources which limit the obtainable system accuracy. $N_s$ is the search oscillator internal phase noise, and $N_c$ is the counter resolution noise distributed between ±0.5 cycle at the counter output.

Figure 4:
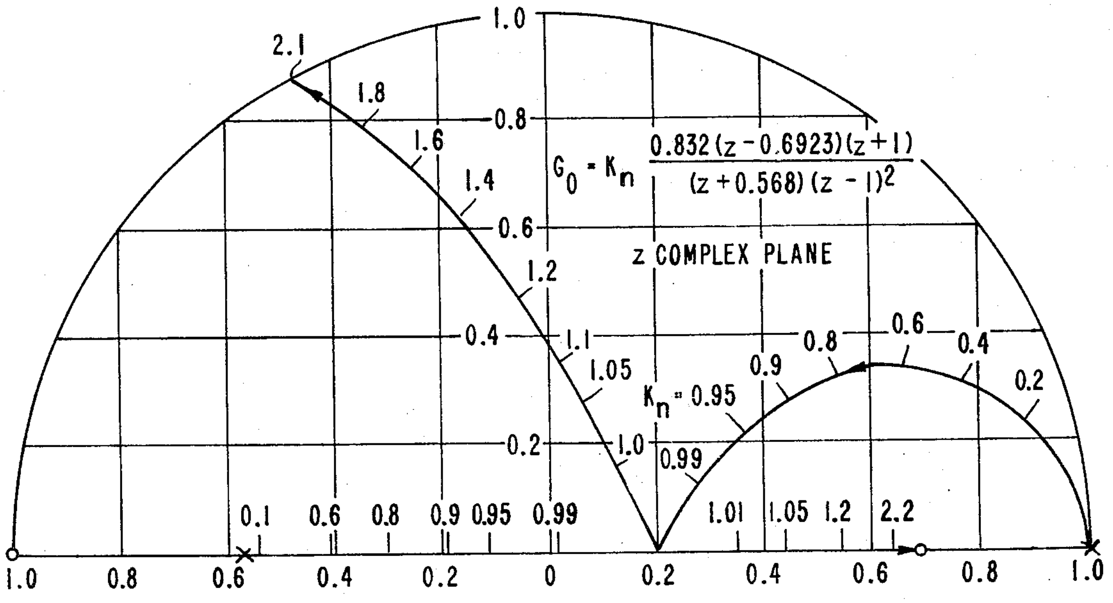
FIG. 4 is a closed-loop root locus diagram.

Using the z-transform method of analysis, the open-loop transfer function $G_o$ is as shown in FIG. 4. The digital filter equation has been chosen to cluster the poles of the closed-loop error transfer function $G_c$ at $z$ equal to 0.2 where $$G_c = 1/1 + G_o$$

This cluster point represents a good comprimise between the minimum transient response time which requires the poles to be clustered at $z$ equal to 0 and the design of system response to internal noise sources which decreases as the cluster point is moved toward the unit circle.

As the gains of the loop components differ from their nominal values, the closed-loop poles will disperse from the design value of 0.2 as shown in the root locus diagram of FIG. 4. Only the upper half plane is shown since the lower half plane is symmetric to the upper half plane about the real axis. $K_n$ is an open-loop normalized gain constant which at unity places the closed-loop poles exactly at 0.2. Significant dispersion takes place for gain variations as little as 1 percent although the system is stable as long as the closed-loop poles remain within the unit circle. Tests on the operating system show that actual gains have remained within 5 percent of assumed values which still results in highly satisfactory operation.

In the particular system the calculations for the digital filter are determinable from its mathematical expression in FIG. 3 and is given by $$Y_n = 12{:}65\ (E_n - 0{:}6923E_{n-1}) - 0.568\ Y_{n-1}$$

where $Y_n$ is the present output of the filter to DAC 26, $Y_{n-1}$ is the previous output, $E_n$ is the present error number supplied to the filter, and $E_{n-1}$ is the previous error number.

It should be stressed that the particular system which was reduced to practice was described to highlight an example in which the teachings of the invention were incorporated. However, it should be clear that the invention is not limited to the specific embodiment. The invention may be summarized as comprising a controlled oscillator system for providing an output of a changing frequency with respect to time and which is well defined in term of phase. In accordance with the invention the output is provided by a frequency synthesizer with a search oscillator and one which provides an expanded search oscillator output. The latter's frequency range is significantly greater than the frequency range by which the synthesizer output is changeable as a function of the oscillator's frequency. In the foregoing examples the expanded output is assumed to vary from 1 MHz to 5 Mhz as the synthesizer's frequency varies from −100 Hz to +100 Hz. Thus, in the example, a change of 1 Hz in the synthesizer output results in a change of 20,000 Hz in the expanded output.

The expanded output is supplied to a counter which operates continuously and increments the count therein by one for each cycle of the expanded output. At predetermined intervals, e.g., every 0.1 second, the counter is sampled without interrupting its counting operation. The sample number obtained therefrom is compared with a prestored or calculated theoretical number which should be present in the counter if the frequency and phase of the synthesizer output are as precalculated for the particular instant in time. Any difference between the theoretical number and the sample number are used to generate an error number which is used to control the input to the search oscillator and thereby vary its frequency. This results in a change in the frequency of the expanded output and, more particularly, changes the frequency and phase of the synthesizer output so that it is within the desired design limits.

It should be stressed that in the present invention the sample number which is compared with a corresponding theoretical number is the absolute count in the counter rather than the difference between the present count in the counter and the count therein during a previous sampling instant. For example, if the count in the counter at one sampling instant at $t_0$ is X0 and during a subsequent sampling instant at $t_1$ is X1 the number which is compared with the theoretical number is X1, rather than X1−X0. Since the number accumulated in the counter is from the beginning of the operation, any error in this number as compared with the theoretical number represents, in addition to frequency error, phase error which is correctable by adjusting the frequency of the search oscillator. Thus, the feedback loop in the present invention is a phase control feedback loop rather than a frequency control feedback loop. It should be pointed out that the counter automatically recycles through zero when a full count is reached therein. However, the count therein each sampling instant is a function of the count accumulated therein from the beginning of the operation.

As previously pointed out in the present invention the synthesizer is assumed to have a symmetrical search oscillator so that tuning can be achieved about any frequency to which the synthesizer is set. Thus, for example if the desired tuning range is from 30,000,050 Hz to 30,000,150 Hz, the synthesizer is initially set to 30,000,100 Hz and the search oscillator is tuned to ±50 Hz. With a synthesizer not having a symmetrical search oscillator the latter can only operate in integral multiples of 100 Hz. Thus, for the above example it would be required to split the desired range into two parts: from 30,000,050 Hz to 30,000,100 and from 30,000,100 Hz to 30,000,150. Since each new setting of the synthesizer results in phase loss, reducing the number of required range splittings is most desirable which is achieved by using a synthesizer having a symmetrical search oscillator.

It should be pointed out that if the desired frequency range of the output is greater than the search oscillator range more than one setting of the synthesizer is needed. For example, if the desired tuning range is from 30,000,000 Hz to 30,000,400 Hz and the tuning range is only ±100 Hz, the synthesizer is first set to 30,000,100 and the search oscillator to −100 Hz for a net output frequency of 30,000,100 − 100 = 30,000,000 Hz. Then, when the frequency reaches 30,000,100 + 100 = 30,000,200 Hz, the synthesizer is quickly set to 30,000,300 Hz and the search oscillator to −100 Hz. Thereafter tuning proceeds until the search oscillator is at +100 Hz for a net output frequency of 30,000,300 + Hz = 30,000,400 Hz.

In the embodiment in which the computer 35 is employed the settings of the synthesizer may be controlled remotely by the computer through a decade controller 40 (see FIG. 2). Basically, the latter remotely sets the synthesizer's decades to the desired fixed frequency as a function of the control signal from the computer.

Although particular embodiments of the invention have been described and illustrated herein, it is recognized that modifications and variations may readily occur to those skilled in the art and consequently it is intended that the claims be interpreted to cover such modifications and equivalents.

What is claimed is:

1. A controlled oscillator system for providing an output of a frequency which changes with respect to time and with a defined phase, the system comprising:

frequency synthesizer means for providing said output, said frequency synthesizer means being settable to a preselected frequency and including a search oscillator for varying the frequency of said output from said preselected frequency over a range of *X*Hz as a function of an input signal applied to said search oscillator;

first means for providing an expanded search oscillator output of a frequency variable over a range of $y$Hz, where $x$ and $y$ are integers and $y>>x$;

counter means coupled to said first means for counting each cycle of said expanded search oscillator output;

second means for sampling the absolute number in said counter means during each of a succession of sampling instances and for providing for each sampling instant a difference number which is the difference between the actual number in said counter means at the instant of sampling and a theoretical number, representing the number which should be present in said counter means at the sampling instant; and control means responsive to said difference number for controlling the input signal to said search oscillator as a function of said difference number.

2. A controlled oscillator system as described in claim 1 wherein said search oscillator is a symmetrical search oscillator for varying said output frequency, definable as $f_o$, from said preselected frequency, definable as $f_s$, to be $f_o = f_s - ½x$ when said search oscillator is at one end of its frequency range and to be $f_o = f_s + ½x$ when said search oscillator is at the other end of its frequency range, said first means providing the expanded output of a frequency, definable as $f_1$, when $f_o = f_s - ½x$ and $f_2$ when $f_o = f_s + ½x$, $f_2 - f_1 = y$, and $y$ over $x$ is not less than 100.

3. A controlled oscillator system as described in claim 1 further including computing means for computing for each sampling instant the theoretical number which should be present in said counter means at said sampling instant as a function of the desired frequency and phase of the synthesizer output at the sampling instant, said computing means including said second means and filter means for generating a numerical output as a function of at least two-successive difference numbers from said second means.

4. A controlled oscillator system as described in claim 3 wherein said filter means is a digital filter which generates each numerical output as a function of a present difference number supplied thereto, a preceding difference number supplied thereto and a numerical output previously generated by said digital filter.

5. A controlled oscillator system as described in claim 1 wherein said control means includes filter means responsive to each difference number for generating a control number, digital-to-analog converter means for converting the control number into an analog error control signal, and integrating means for controlling the input to said search oscillator as a function of the analog error control signal.

6. A controlled oscillator system as described in claim 5 wherein said filter means is a digital filter providing each control number as a function of the difference number supplied thereto, the preceding difference number supplied thereto and the preceding control number provided by said digital filter.

7. A controlled oscillator system as described in claim 6 wherein said search oscillator is a symmetrical search oscillator for varying said output frequency definable as $f_o$ from said preselected frequency definable as $f_s$ to be $f_o = f_s - ½x$ when said search oscillator is at one end of its frequency range and to be $f_o = f_s + ½x$ when said search oscillator is at the other end of its frequency range, said first means providing the expanded output of a frequency definable as $f_1$ when $f_o = f_s + ½x$, $f_2 - f_1 = y$ and $y$ over $x$ is not less than 100.

8. A controlled oscillator system as described in claim 7 wherein $x$ is in the range of several hundred Hz and $y$ is in the range of several million Hz.

* * * * *